United States Patent
Reznik et al.

[11] Patent Number: 6,066,542
[45] Date of Patent: May 23, 2000

[54] METHOD FOR THE MANUFACTURE OF A POWER SEMICONDUCTOR COMPONENT

[75] Inventors: Daniel Reznik, Munich; Hans-Joachim Schulze, Ottobrunn; Wolfgang Eckhard, Munich, all of Germany

[73] Assignee: Siemens Aktiengesellschaft, Munich, Germany

[21] Appl. No.: 09/240,837

[22] Filed: Feb. 1, 1999

[30] Foreign Application Priority Data

Feb. 3, 1998 [DE] Germany .............. 198 04 192

[51] Int. Cl.$^7$ .................................................. H01L 21/76
[52] U.S. Cl. ................ 438/406; 438/400; 438/135; 438/133
[58] Field of Search ................. 438/406, 404, 438/400, 135, 133

[56] References Cited

U.S. PATENT DOCUMENTS

| | | |
|---|---|---|
| 5,141,889 | 8/1992 | Terry et al. . |
| 5,183,769 | 2/1993 | Rutter et al. . |
| 5,489,787 | 2/1996 | Amaratunga et al. . |
| 5,591,991 | 1/1997 | Terasawa . |
| 5,602,405 | 2/1997 | Terasawa . |
| 5,608,237 | 3/1997 | Aizawa et al. . |
| 5,702,962 | 12/1997 | Terasawa . |

FOREIGN PATENT DOCUMENTS

| | | |
|---|---|---|
| 0 687 015 | 12/1995 | European Pat. Off. . |
| 0 726 594 | 8/1996 | European Pat. Off. . |

OTHER PUBLICATIONS

"High Frequency 6000 V Double Gate GTOs With Buried Gate Structure," Ogura et al, Proc. Of 1990 Int. Symp. On Power Semiconductor Devices & ICs, Tokyo, pp. 252–255.

"Bubble–Free Silicon Wafer Bonding In A Cleanroom Environment," Stengl et al, Japanese Journal of Applied Physics, vol. 27, No. 12, Dec. 1988, pp. L2364–L2366.

*Primary Examiner*—Kevin M. Picardàt
*Assistant Examiner*—Deven M. Collins
*Attorney, Agent, or Firm*—Hill & Simpson

[57] ABSTRACT

Component structures of, for example, IGBTs are manufactured on the respective top sides of two substrates, the substrates are thinned proceeding from their respective back sides, and, after polishing, the back sides of the thinned substrates are durably electrically conductively connected to one another by wafer bonding.

5 Claims, 2 Drawing Sheets

METHOD FOR THE MANUFACTURE OF A POWER SEMICONDUCTOR COMPONENT

BACKGROUND OF THE INVENTION

1. Field of the Invention

The present invention is directed to a method for manufacturing power semiconductor components with respective circuit structures at two exterior sides lying opposite one another, particularly bidirectional semiconductor switches.

2. Description of the Prior Art

The article by T. Ogura et al., "High frequency 6000 V double gate GTOs with buried gate structure", in Proceedings of 1990 International Symposium on Power Semiconductor devices & ICs, pages 252–255, describes a component structure wherein semiconductor ridges with doped regions and contacts are formed on two opposite exterior sides of a substrate in order to fashion a GTO thyristor. U.S. Pat. No. 5,608,237 discloses a bidirectional semiconductor switch wherein IGBT structures are formed at two opposite exterior sides of a substrate of semiconductor material. As a result of the additional control electrode, such a bidirectional IGBT enables the control of the emitter frequency, and a component with very good switching and transmission properties can be realized in this way. Bidirectional IGBTs can be advantageously utilized in converters (transformers) that are intended to process a sinusoidal mains current, with a low reactance, into the network with the possibility of a simultaneous resupply into the network. A matrix converter suitable for this purpose has nine bidirectional switches that can be replaced by eighteen symmetrically blocking IGBTs that are arranged in pairs, the two IGBTs in each pair being connected with opposite polarities. A simple realization of the components disclosed in U.S. Pat. No. 5,608,237 offers considerable advantage in this context.

SUMMARY OF THE INVENTION

An object of the present invention is to provide a method for the manufacture of a power semiconductor component that is simple to implement and that is also suitable for the manufacture of complicated semiconductor structures on two opposite exterior sides of a thin substrate.

This object is achieved in a method according to the invention wherein two substrates of semiconductor material that is provided with a basic doping for electrical conductivity are employed for each component. Electrically conductive regions of a circuit structure for the component are produced with standard method steps including doping at the respective top sides of these substrates. Further semiconductor layers can be epitaxially grown on these regions and contacts can be applied thereon. After the semiconductor structure in each substrate has been finished, or at least finished to such an extent that it is possible to continue processing the component proceeding from both sides, the substrates are thinned proceeding from the unstructured back side. This can occur, for example, by grinding or re-etching. The respective back sides of the thinned substrates are then mechanically and electrically conductively connected to each other, preferably by wafer bonding. An electrically conductive connection between the structures of the two top sides (now two exterior sides) is thus produced because of the existing basic doping. A component that is mirror-symmetrically constructed relative to a middle plane of the substrate can be manufactured in a simple way. In particular, bidirectional semiconductor switches thus can be manufactured.

DESCRIPTION OF THE PREFERRED EMBODIMENTS

Figure 1:
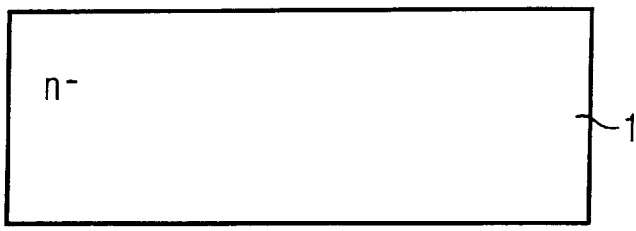
FIGS. 1A through 1E show steps of an embodiment of the inventive method for producing IGBTs in DMOS technology.
Figure 1:
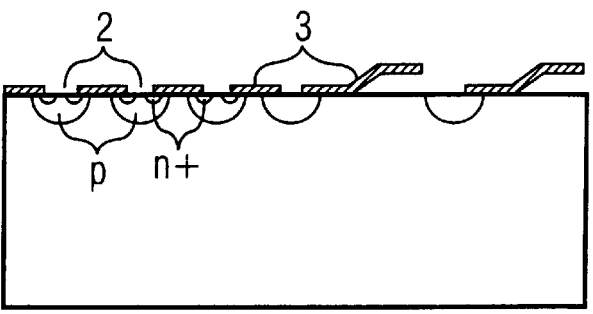
Figure 1:
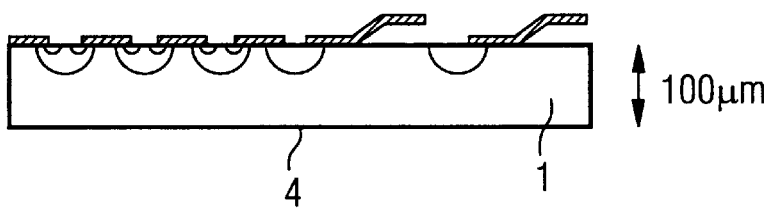
Figure 1:
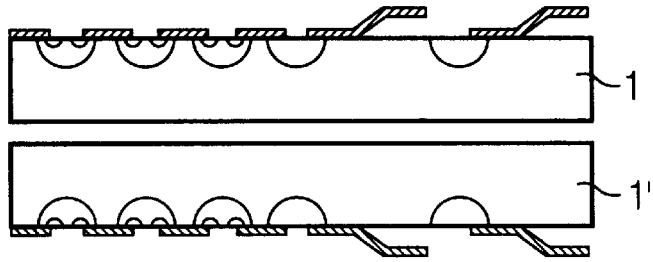
Figure 1:
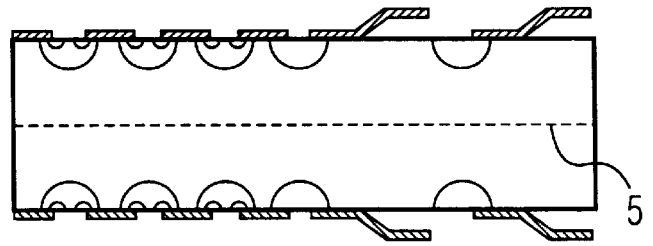
Figure 2A:
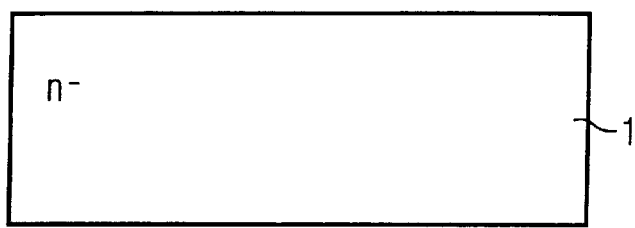
FIGS. 2A through 2E show steps of an embodiment of the inventive method for producing IGBTs in trench technology.
Figure 2B:
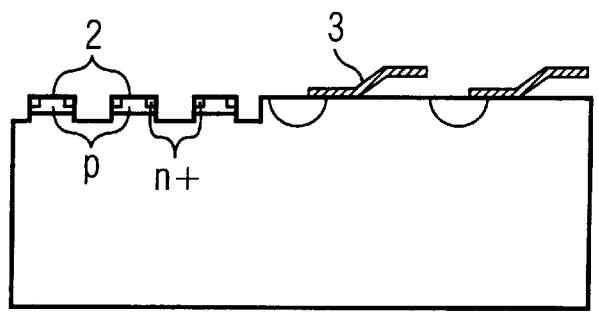

The inventive method begins with a substrate 1 (FIG. 1A or FIG. 2A) of normal thickness that is provided with a basic doping, preferably a low doping, for electrical conductivity, n -conductivity in the illustrated example. The intended component structure is produced at a top side of the substrate 1. The illustrated examples of FIGS. 1B and 2B show IGBT structures 2 with terminal contacts 3 applied thereon. IGBTs are produced in DMOS technology in the exemplary embodiment of FIGS. 1A–1E; IGBTs that are separated from one another by trenches (trench technology) are produced in the exemplary embodiment of FIGS. 2A–2E.

Figure 2C:
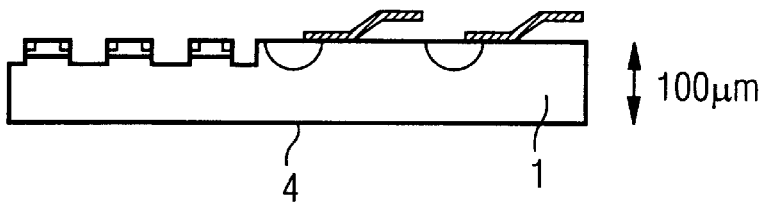
Figure 2D:
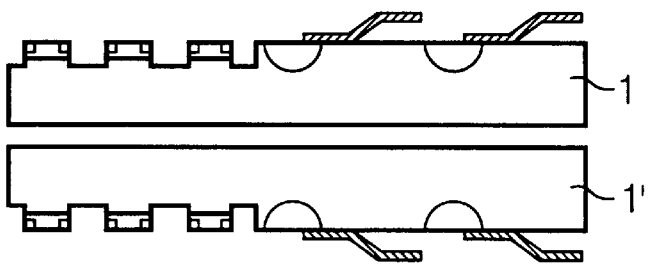
Figure 2E:
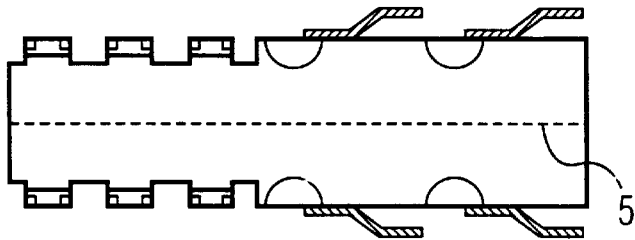

In a next method step according to FIGS. 1C and 2C, the substrate 1 is thinned proceeding from the back side, which can be accomplished, for example, by grinding or etching. A residual substrate thickness of approximately 100 μm remains in the example of a 1200 V IGBT; a residual thickness of approximately 140 μm remains given a 1700 V IGBT. The ground-down back sides are polished as warranted, so that they are smooth enough for the process of wafer bonding which is to follow.

A second substrate 1' (FIG. 1D or FIG. 2D) pre-treated in a similar way, has a back side which is durably secured to the back side of the first substrate 1. To that end, the substrates 1 and 1' are pressed against one another, for example under clean room conditions, and are maintained under pressure and temperature conditions that are known for the appertaining materials. It is important to produce a union of the substrates at comparatively low temperatures below approximately 300° C. through 400° C. (typical upper limit at 350° C.) without damaging the semiconductor structures that have already been produced. As a result, the doped semiconductor wafers are durably electrically conductively joined, so that a component having the desired dimension (basic thickness) arises that has an intended structuring at two opposite top sides. The component according to the examples of FIGS. 1E or 2E thus arises, the connecting surface 5 of the original substrates being indicated therein with a thin dotted line.

Power semiconductor components with double-sided structuring and with a comparatively low thickness of the base region provided with the basic doping can be manufactured with this method, these being suitable for applications in specific ranges of the operating parameters. In particular, components that are mirror-symmetrical relative to the connecting surface 5, such as bidirectional semiconductor switches, can be manufactured. It is possible to produce different structures or different dopings in the two substrates to be connected to one another, as desired, for example, in the case of the GTO thyristor of the initially cited publication. Advantages of the method are that the components can be manufactured in a standard process up to the thinning, so that the added outlay compared to known methods can be kept slight. The thinning of the substrates can be implemented such that the residual thickness of the substrates yields the intended basic thickness that corresponds to the desired voltage class of the component, which can be significantly lower than for power semiconductor components with double-sided structuring that are manufactured according to conventional methods.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for manufacturing a power semiconductor component, comprises the steps of:

providing a first substrate composed of an electrically conductively doped semiconductor material having a top side and bottom side opposite each other, and a second substrate composed of said electrically conductive doped semiconductor material having a top side and a bottom side opposite each other;

generating doped regions and contacts on said top side of said first substrate and on said top side of said second substrate;

thinning said first substrate from said back side of said first substrate to produce a thinned first substrate and thinning said second substrate from said back side of said second substrate to produce a thinned second substrate; and mechanically and electrically conductively joining said thinned first substrate and said thinned second substrate at the respective back sides thereof.

2. A method as claimed in claim 1 wherein the step of joining said thinned first substrate and said thinned second substrate comprises wafer bonding said thinned first substrate and said thinned second substrate.

3. A method as claimed in claim 2 wherein the step of wafer bonding comprises wafer bonding said thinned first substrate and said thinned second substrate at a temperature below 350° C.

4. A method as claimed in claim 1 wherein the step of generating doped regions and contacts on said top side of said first substrate and on said top side of said second substrate comprises generating IGBT structures on said top side of said first substrate and on said top side of said second substrate.

5. A method as claimed in claim 1 wherein the step of generating doped regions and contacts on said top side of said first substrate and on said top side of said second substrate comprises generating GTO thyristors on said top side of said first substrate and on said top side of said second substrate.

* * * * *